United States Patent [19]

Maas et al.

[11] Patent Number: 5,885,497
[45] Date of Patent: *Mar. 23, 1999

[54] METHOD OF MAKING A METALLIZED PLASTIC ARTICLE

[75] Inventors: Christianus Johannes Jacobus Maas, NJ Rilland, Netherlands; Luca Pietro Fontana, Brasschaat, Belgium; Robertus Eduard de Jong, Ma Bergen op Zoom, Netherlands; Michael Bernhard Grimm, Dorsheim, Germany

[73] Assignee: General Electric Company, Pittsfield, Mass.

[*] Notice: The term of this patent shall not extend beyond the expiration date of Pat. No. 5,503,934.

[21] Appl. No.: 950,307

[22] Filed: Oct. 14, 1997

Related U.S. Application Data

[60] Continuation of Ser. No. 574,823, Dec. 19, 1995, abandoned, which is a division of Ser. No. 333,709, Nov. 3, 1994, Pat. No. 5,503,934.

[51] Int. Cl.$^6$ .................................................. B29C 39/12
[52] U.S. Cl. ................. 264/129; 264/250; 264/DIG. 78; 427/250
[58] Field of Search ............................. 264/81, 129, 250, 264/259, 510, DIG. 78; 427/404, 409, 250

[56] References Cited

U.S. PATENT DOCUMENTS

| | | |
|---|---|---|
| 3,169,121 | 2/1965 | Goldberg . |
| 4,238,596 | 12/1980 | Quinn . |
| 4,400,100 | 8/1983 | Aviram et al. . |
| 4,714,746 | 12/1987 | Serini et al. . |
| 4,786,708 | 11/1988 | Serini et al. . |
| 4,983,706 | 1/1991 | Fontana . |
| 5,025,081 | 6/1991 | Fontana . |
| 5,037,220 | 8/1991 | Serini et al. . |
| 5,114,791 | 5/1992 | Stahlke et al. . |
| 5,275,882 | 1/1994 | Conley . |

FOREIGN PATENT DOCUMENTS

| | | |
|---|---|---|
| 469404 | 5/1992 | European Pat. Off. . |

*Primary Examiner*—Jan H. Silbaugh
*Assistant Examiner*—Edmund H. Lee

[57] ABSTRACT

It is possible to manufacture articles out of thermoplastic materials and to metallize the articles at their surface. In this way one can manufacture reflectors and similar articles. Most thermoplastic materials require processing steps prior to the metallization like application of primers, chemical etching and the like. The invention is based on the discovery that a certain type of materials can be metallized without any extra processing steps. The materials involved are polyestercarbonates or blends of polyestercarbonates and polycarbonate. This is quite surprising since polycarbonates can not be metallized in good quality without extra processing steps prior to the metallization step.

7 Claims, No Drawings

METHOD OF MAKING A METALLIZED PLASTIC ARTICLE

This is a continuation of application Ser. No. 08/574,823, filed Dec. 19, 1995, now abandoned, which is a divisional of application Ser. No. 08/333,709, filed Nov. 3, 1994, now U.S. Pat. No. 5,503,934.

The invention relates to an article made out of a metallized thermoplastic material wherein the material is a polyester carbonate or a blend of a polycarbonate and a polyester carbonate.

It is generally known to mold objects out of thermoplastic materials and to metallize the obtained objects completely or partly at their surface. To obtain a good adhesion between the thermoplastic material and the metal layer it is usually required to incorporate in the thermoplastic materials additives. Alternatively it is possible to subject the surface to be metallized to a pretreatment prior to the actual metallization step.

In some applications like mirrors and reflectors for the automotive industry aromatic polycarbonates are a preferred thermoplastic material. Unfortunately it is not possible to metallize objects made out of polycarbonate without taking certain extra precautions as indicated above.

It has now surprisingly been found that materials very similar to polycarbonate's can be directly metallized.

According to the invention the articles are made out of a polyestercarbonate or out of a blend of an aromatic polycarbonate and a polyestercarbonate.

The articles of the invention can be obtained by conventional processes for molding thermoplastic materials like extrusion and injection molding. After the molding step the obtained objects can be metallized by conventional metallization processes like vacuum deposition or sputtering. Aluminum is the preferred metal. A pretreatment of the surface to be metallized is however not required. The incorporation of special additives is not required either.

As stated above the articles are made out of a polyestercarbonate or a blend of a polyestercarbonate and an aromatic polycarbonate. The polyestercarbonate and the blend of the polyestercarbonate and the polycarbonate can be admixed with usual additives as long as the additives do not disturb the adhesion between the metal layer and the thermoplastic material.

Polyestercarbonates and aromatic polycarbonates are generally known materials which are readily available.

Suitable polyestercarbonates can be obtained by an esterification reaction of a carbonate precursor such as phosgene or diphenylcarbonate, a diphenol such as bisphenol A and an ester precursor such as a difunctional carboxylic acid such as terephthalic acid or an ester forming derivative thereof. Polyestercarbonates have ester bonds and carbonate bonds in their polymer chain. Suitable polyestercarbonates have been described in U.S. Pat. No. 3,169,121. A process for the preparation of suitable polyestercarbonates can be found in U.S. Pat. No. 4,238,596 and U.S. Pat. No. 4,238,597. The ester bonds can also be derived from aliphatic dicarboxylic acids or mixtures of aliphatic and aromatic dicarboxylic acids. In this context a reference can be made to U.S. Pat. No. 4,983,706 and U.S. Pat. No. 5,025,081.

It is preferred that the polyestercarbonate or the blend of the polyestercarbonate and the polycarbonate comprises a minimum content of ester bonds.

For the polyestercarbonate and for the blend of the polyestercarbonate and the polycarbonate this minimum is 10 mol%. This has been calculated in both cases with respect to the total number of ester bonds plus carbonate bonds. In the case of a blend the number of carbonate bonds is taken together from the polyestercarbonate plus the polycarbonate.

Aromatic polycarbonates are generally prepared by reacting a dihydric phenol compound with a carbonate precursor, for example, phosgene, a halogen formate or a carbonate ester. Aromatic polycarbonates are polymers which comprise units of the formula

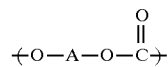

wherein A is a bivalent aromatic radical which is derived from the dihydric phenol used in the preparation of the polymer. Dihydric phenols which may be used in the preparation of the aromatic polycarbonates are mononuclear or polynuclear aromatic compounds which comprise two hydroxy radicals each directly bonded to a carbon atom of an aromatic nucleus. Said dihydride phenols may be substituted with one or more halogen atoms or one or more alkyl groups.

Branched polycarbonates known per se, as described, for example in U.S. Pat. No. 4,001,184, are also suitable.

The blend of the aromatic polycarbonate and the polyestercarbonate can be prepared by conventional processes like melt blending compounding in an extruder.

All patents mentioned herein are incorporated herewith by this reference.

The invention will be illustrated by the following examples.

EXAMPLES

The following materials have been used in the examples:

Polyestercarbonate: a polyestercarbonate in the form of pellets derived from bisphenol A, terephthaloylchloride and isophthaloylchloride. The overall composition was as follows: 80% ester bonds (8% from terephthaloylchloride and 72% from isophthaloylchloride) and 20% carbonate bonds. The polyester carbonate had an IV of 51 ml/g as measured in $MeCl_2$ at 25 degrees C.

Aromatic polycarbonate: a polycarbonate homopolymer in the form of pellets derived from phosgene and bisphenol A with an intrinsic viscosity of 52 ml/g as measured in $MeCl_2$ at a temperature of 25 degrees C.

For the examples where a blend of the polyestercarbonate and the polycarbonate was used, the blend was prepared by compounding the materials in the indicated quantities in an extruder with an average temperature setting of 300 degrees C. The extrudate was pelletized.

Of each of the different compositions indicated below discs were made by a conventional injection molding process. The discs as obtained from the molding process were metallized by vacuum deposition of aluminum.

The adhesion of the metal layer was tested as follows. With a cross hatch knife a grid is cut through the metallization layer. An adhesive tape was pressed by hand upon the metallized side of the disc. After 0.5 minutes the tape was torn off the surface by hand. The percentage of the surface which remained properly metallized was determined; the higher this percentage is the better the adhesion between the metal layer and the thermoplastic substrate.

The tested compositions and the measured results are given here below in Table A.

TABLE A

| Composition | Adhesion test result remaining percentage of metal layer |
|---|---|
| 100% by weight polyestercarbonate | more than 95 |
| 60% by weight polyestercarbonate + 40% by weight polycarbonate | about 90 |
| 40% by weight polyestercarbonate + 60% by weight polycarbonate | about 80 |
| 20% by weight polyestercarbonate + 80% by weight polycarbonate | about 65 |
| pure polycarbonate | less than 50 |

As can be seen from the results of the table, articles made out of pure polyestercarbonate have a very good adhesion to a metal layer even when the layer has been applied upon the formed object without taking any special precautions. Pure polycarbonate shows a very bad result. Addition of relative small amounts of polyestercarbonate (as little as 20% by weight, resulting in an ester bond content of 16 mol%) results in a remarkable increase in the adhesion.

We claim:

1. A method for making a metallized thermoplastic article comprising:
   forming a shaped article from a composition consisting essentially of a polyestercarbonate or a blend of an aromatic polycarbonate and a polyestercarbonate wherein the composition contains a minimum content of ester bonds of 10 mole % calculated with respect to the total of ester bonds and carbonate bonds; and
   applying directly to the surface of the shaped article a layer of metal.

2. The method of claim 1 wherein the forming is by injection molding.

3. The method of claim 2 wherein the layer of metal is applied by vacuum metallizing.

4. The method of claim 1 wherein the layer of metal is applied by vacuum metallizing.

5. The method of claim 1 wherein the layer of metal is applied to the entire surface of the shaped article.

6. The method of claim 1 wherein the layer of metal is applied only to a portion of the surface of the shaped article.

7. The method of claim 1 wherein the metal is aluminum.

* * * * *